US008247269B1

(12) United States Patent
Liu

(10) Patent No.: US 8,247,269 B1
(45) Date of Patent: Aug. 21, 2012

(54) WAFER LEVEL EMBEDDED AND STACKED DIE POWER SYSTEM-IN-PACKAGE PACKAGES

(75) Inventor: Yong Liu, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/171,577

(22) Filed: Jun. 29, 2011

(51) Int. Cl.
*H01L 21/00* (2006.01)
(52) U.S. Cl. .................. 438/107; 438/458; 257/E21.505
(58) Field of Classification Search ..................... 438/63; 257/E21.5
See application file for complete search history.

(56) References Cited

U.S. PATENT DOCUMENTS

| 7,855,439 | B2 | 12/2010 | Liu |
| 7,863,096 | B2 | 1/2011 | England |
| 2012/0001328 | A1* | 1/2012 | Chang et al. ................. 257/738 |

* cited by examiner

*Primary Examiner* — Cheung Lee
(74) *Attorney, Agent, or Firm* — Kenneth E. Horton; Kirton McConkie, PC

(57) ABSTRACT

Wafer level embedded and stacked die power system-in-package semiconductor devices, and methods for making and using the same, are described. The methods include placing a first side of a substrate frame, which includes through cavity and an adjacent via, on a carrier. A first side of a component selected from an active device and a passive device can be placed on the carrier, within the cavity. A perimeter of the cavity can be attached to a perimeter of the component. Material at a second side of the substrate frame can be removed so the via extends from the frame's first side to the frame's second side. The substrate frame and component can then be removed from the carrier so that routing can be distributed between the first side of the frame and the first side of the component to electrically connect the component with the via. Other embodiments are described.

20 Claims, 7 Drawing Sheets

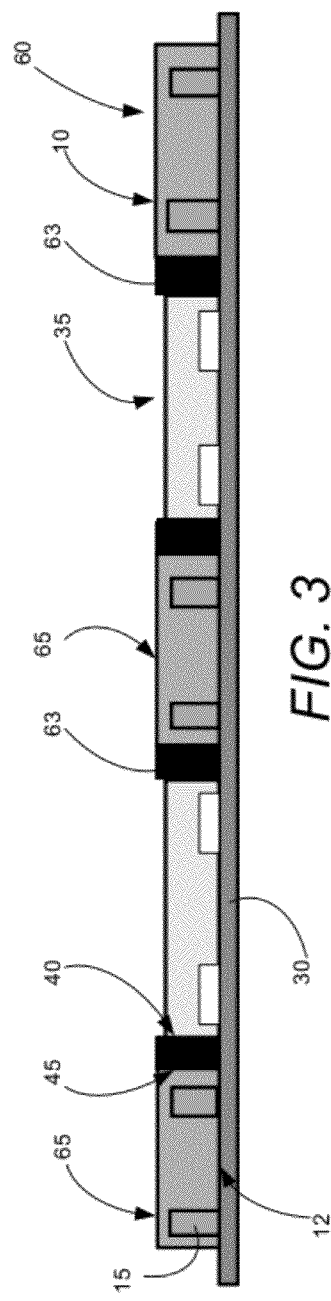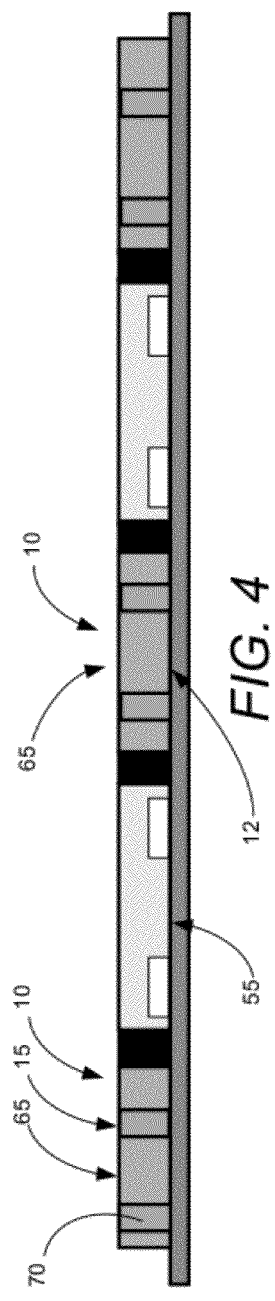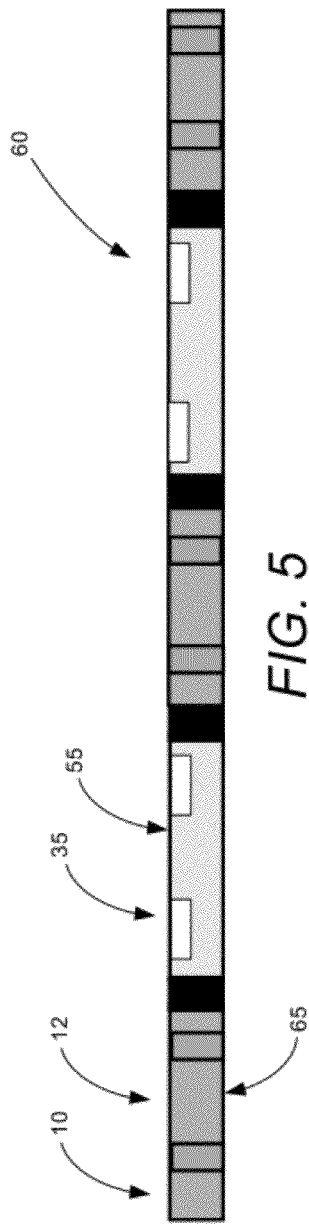

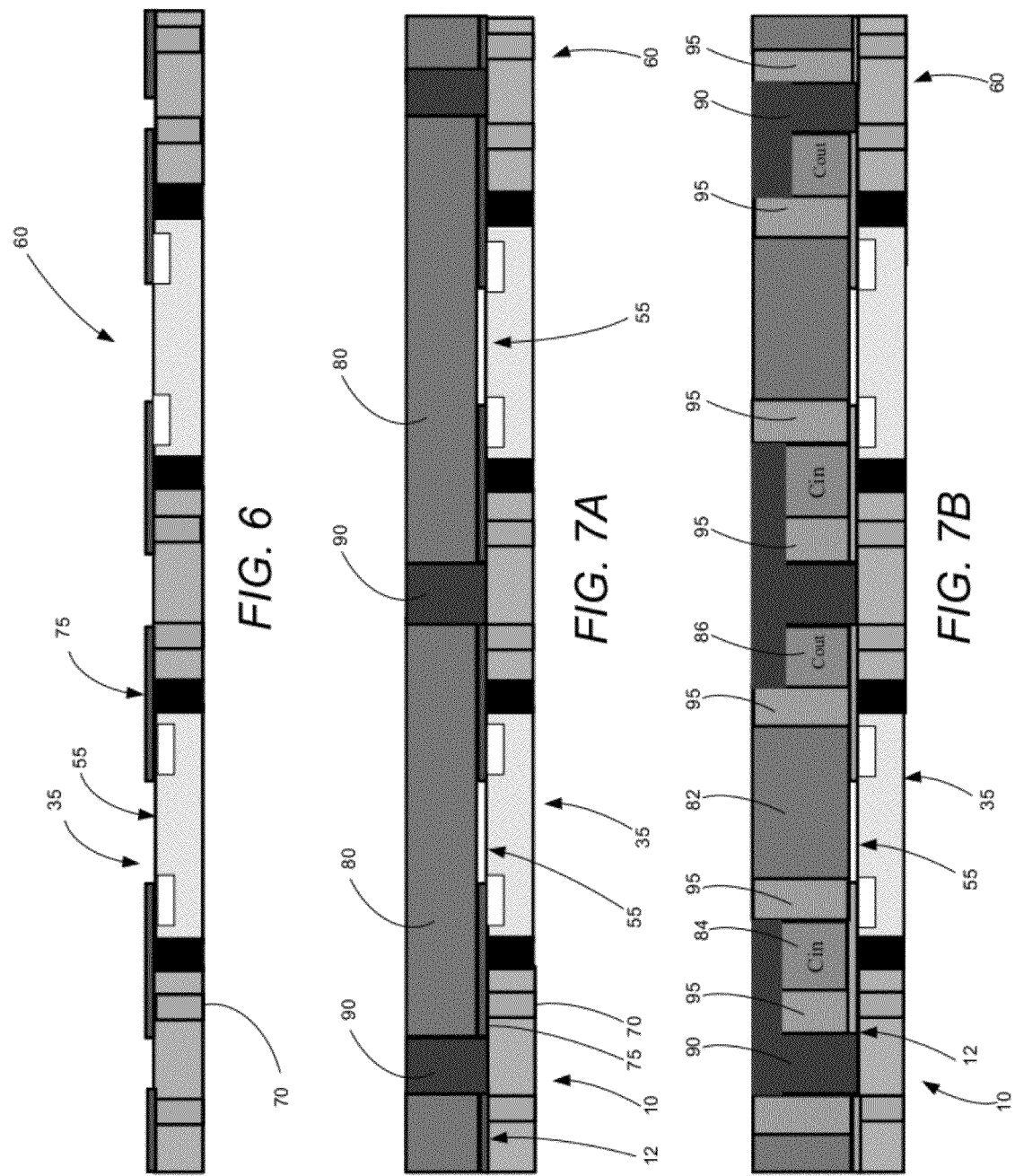

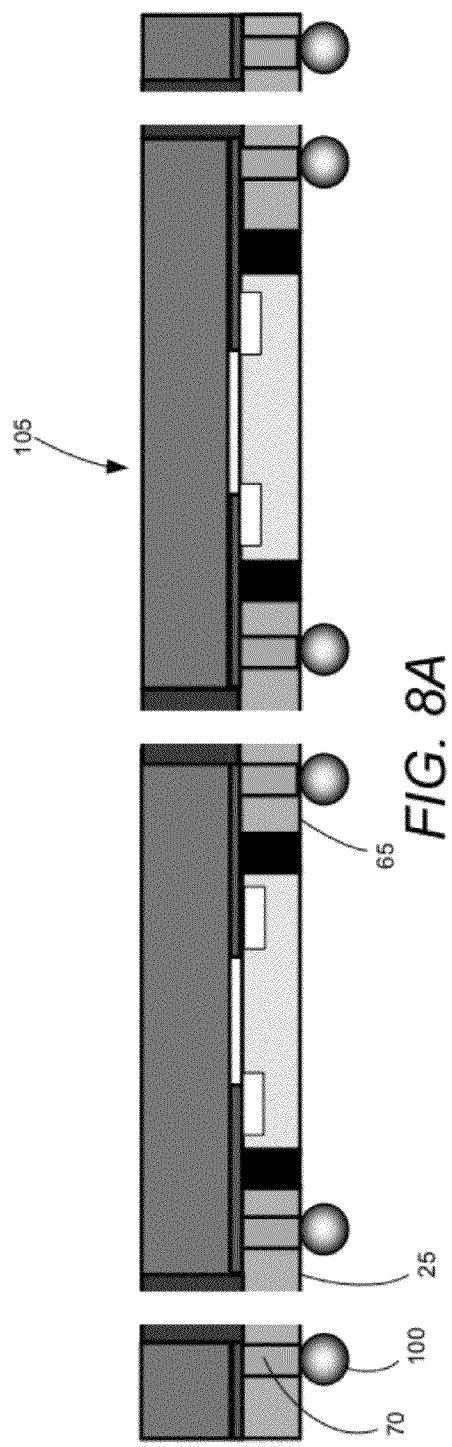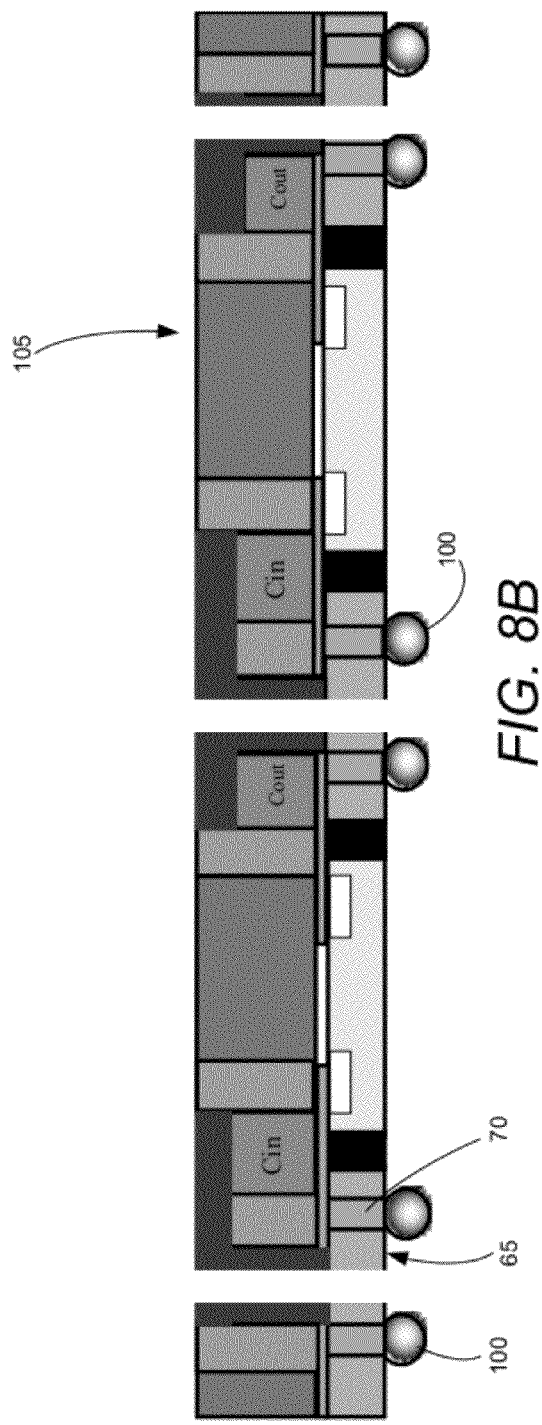

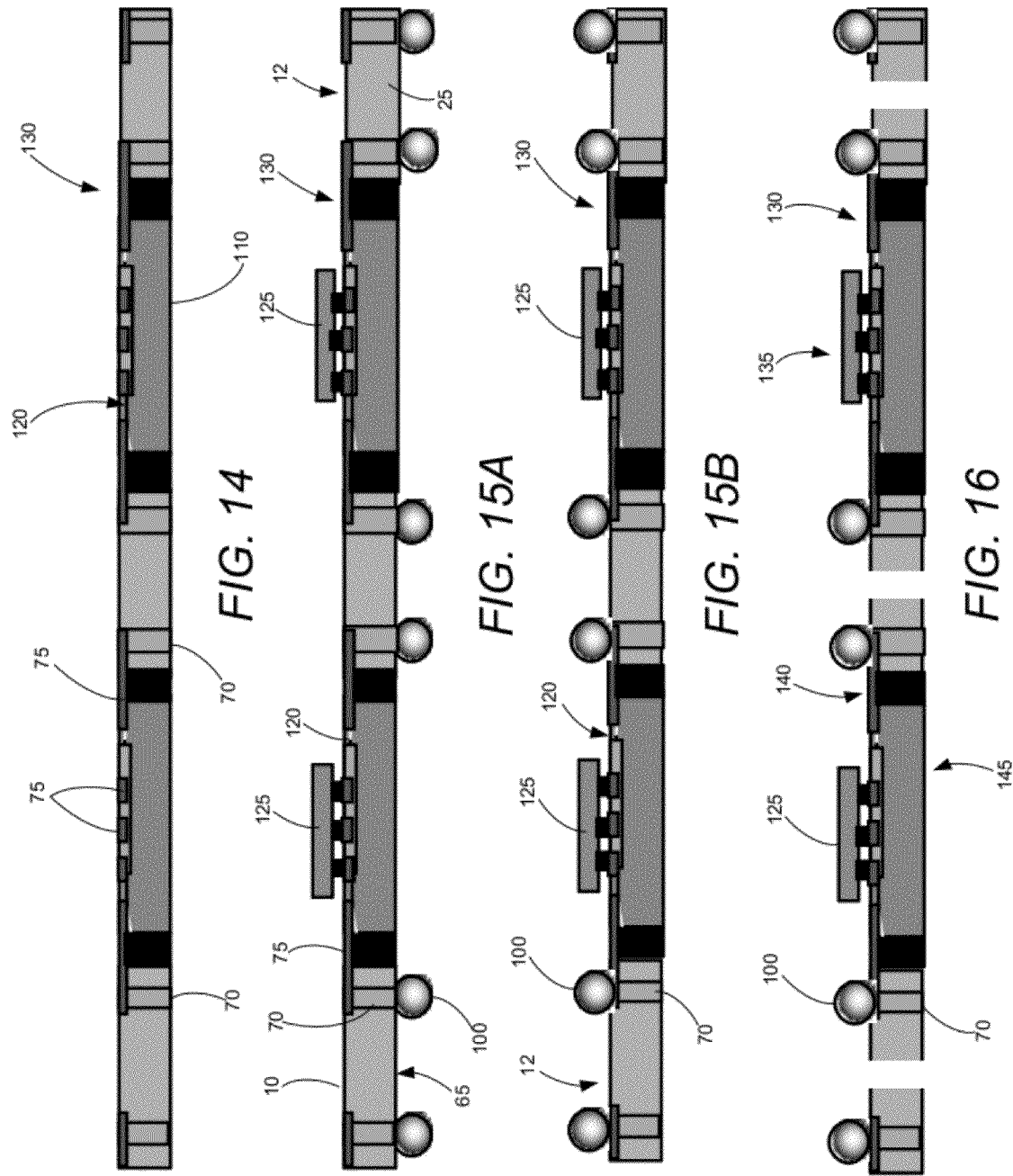

WAFER LEVEL EMBEDDED AND STACKED DIE POWER SYSTEM-IN-PACKAGE PACKAGES

FIELD

This application relates generally to semiconductor devices and methods for making such devices. More specifically, this application relates to wafer level embedded and stacked die power system-in-package semiconductor devices, as well as methods for making and using the same.

BACKGROUND

Semiconductor devices containing integrated circuits (ICs) are used in a wide variety of electronic apparatus. The IC devices (or chips) comprise a miniaturized electronic circuit that has been manufactured on the surface of a substrate (or die) of semiconductor material. The circuits are composed of many overlapping layers, including layers containing dopants that can be diffused into the substrate (called diffusion layers) or ions that are implanted (implant layers) into the substrate. Other layers are conductors (polysilicon or metal layers) or connections between the conducting layers (via or contact layers). IC devices can be fabricated in a layer-by-layer process that uses a combination of many steps, including imaging, deposition, etching, doping, and cleaning. One of the latter steps in the semiconductor fabrication process forms the packaging that is used to protect the IC device from environmental hazards.

After it has been formed, the semiconductor package is often used in an ever growing variety of electronic applications, such as point of load buck converters, DrMos in disk drives, USB controllers, portable computer devices, cellular phones, digital music players, and so forth. Depending on the size of the die and the electronic application, the semiconductor package may be highly miniaturized and may need to be as small as possible.

SUMMARY

This application relates to wafer level embedded and stacked die power system-in-package semiconductor devices, as well as methods for making and using the same. Generally, the methods include placing a first side of substrate frame (such as a glass substrate frame) face down on a carrier, wherein the substrate frame includes one or more through cavities with one or more vias adjacent to each cavity. A first side of a component (an active device and/or a passive device) can also be placed down on the carrier within the cavity of the substrate frame. A perimeter of the cavity of the substrate frame can be attached to a perimeter of the component. Material at a second side of the substrate frame can be removed, creating a through-via that extends from the first side to the second side of the substrate frame. The substrate frame and the attached component can then be removed from the carrier so that metallization or other routing can be distributed between the first side of the substrate frame and the first side of the component to electrically connect the component with the through-via.

Where the device comprises a wafer level embedded package, the component can comprise an active device (such as an IC die) and one or more passive components (such as an inductor) can be stacked on and electrically attached to the first side of the active device and/or the substrate frame. Where the device comprises a stacked die power system-in-package semiconductor device, the component can comprise a passive device (such as a passive inductor) and an active component (such as an IC die) can be stacked on and be electrically connected to the first side of the passive device.

BRIEF DESCRIPTION OF THE DRAWINGS

The following description can be better understood in light of the Figures, in which:

FIG. 3 depicts some embodiments of a portion of a method for making semiconductor packages, wherein the active devices are attached to a perimeter of a cavity in the substrate frame;

FIG. 4 depicts some embodiments of a portion of a method for making semiconductor packages, wherein some material at a backside of the substrate frame is removed to make through-vias;

FIG. 5 depicts some embodiments of a portion of a method for making semiconductor packages, wherein the substrate frame and attached active devices are removed from the carrier and flipped;

FIG. 6 depicts some embodiments of a portion of a method for making semiconductor packages, wherein metallization is applied between the active devices and one or more of the vias that are adjacent to each device;

FIG. 7A depicts some embodiments of a portion of a method for making semiconductor packages, wherein a first passive component is stacked on the active device;

FIG. 7B depicts some embodiments of a portion of a method for making semiconductor packages, where multiple passive components are stacked on the active device;

FIGS. 8A-8B each depict some embodiments of a portion of a method for making semiconductor packages, wherein bumping is added to the vias and the substrate frame and attached devices are singulated into packages;

FIG. 14 depicts some embodiments of a portion of a method for making semiconductor packages, wherein metallization is applied between the passive devices and one or more adjacent vias;

FIGS. 15A-15B each depict some embodiments of a portion of a method for making semiconductor packages, wherein an IC component is stacked on each of the passive devices and bumping is added to the vias; and FIG. 16 depicts some embodiments of a portion of a method for making semiconductor packages, wherein the semiconductor packages are singulated.

Figure 1:
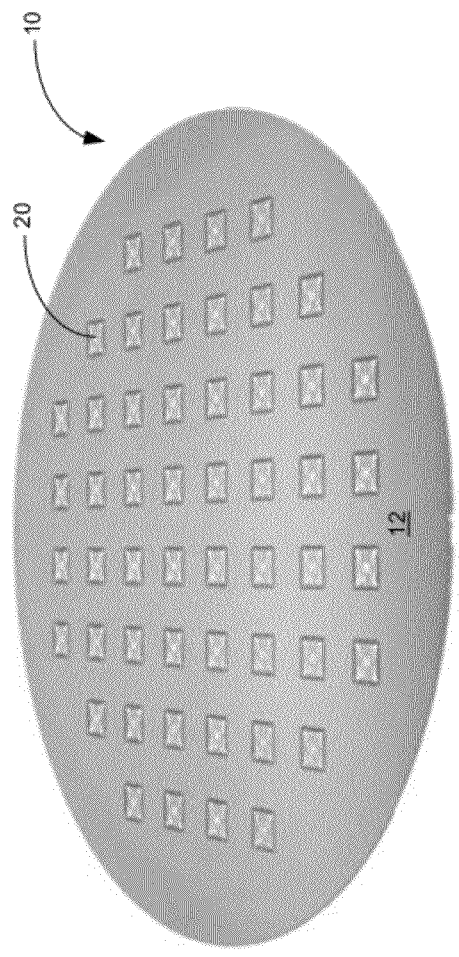
FIG. 1 depicts a perspective view of some embodiments of a wafer-size substrate frame that includes an array of through cavities (or holes)

The Figures illustrate specific aspects of the semiconductor devices and methods for making such devices. Together with the following description, the Figures demonstrate and explain the principles of the methods and structures produced through these methods. In the drawings, the thickness of layers and regions are exaggerated for clarity. The same reference numerals in different drawings represent the same element, and thus their descriptions will not be repeated. As the terms on, attached to, or coupled to are used herein, one object (e.g., a material, a layer, a substrate, etc.) can be on, attached to, or coupled to another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

DETAILED DESCRIPTION

The following description supplies specific details in order to provide a thorough understanding. Nevertheless, the skilled artisan would understand that the described methods for making wafer level embedded and stack die power system-in-package (SiP) semiconductor devices, as well as the packages formed through such methods, can be implemented and used without employing these specific details. Indeed, the described methods and associated semiconductor packages can be placed into practice by modifying the illustrated methods and components and can be used in conjunction with any other apparatus and techniques conventionally used in the industry. For example, while the description below focuses on methods for making and using semiconductor packages for use in portable products (e.g., tiny buck converters for use in cell phones, personal digital assistants, personal media players, cameras, USBs, and so forth), the described methods and associated packages can be used or modified for any other suitable purpose, including DrMos for other devices (e.g., computing devices, consumer devices, communication devices, etc.) in which wafer level embedded packages and stack die power SiP semiconductor packages can be used as a point-of-load device.

Some embodiments of the described methods for making wafer level embedded and stack die power SiP semiconductor devices, as well as some of the associated packages, are shown in the Figures. Specifically, FIGS. 1 through 8B illustrate some embodiments of a method for making wafer level embedded semiconductor packages and FIGS. 9 through 16 illustrate some embodiments of a method for making stack die power SiP packages. In this regard, the methods shown in FIGS. 1 through 16 can be modified by rearranging, adding to, removing, and modifying the various portions of the methods.

FIG. 1 shows that some embodiments of a method that begins by providing a wafer-size substrate frame (substrate frame) 10. This substrate frame can comprise any suitable substrate material. Some examples of suitable substrate materials include glass, pre-molded epoxy molding compound, silicon, and combinations thereof. Some configurations of the substrate frame comprise glass because glass can be a low cost material that has a relatively good level of electrical isolation performance and because glass can allow the substrate frame to be relatively stiff so as to avoid significant warping during processing, The substrate frame 10 can further comprise one or more cavities (or holes) 20 that extend through the substrate frame. In this regard, the substrate frame can comprise any suitable number of cavities, including 1, 2, 3, . . . n. By way of non-limiting example, FIG. 1 shows the substrate frame 10 can comprise an array of 52 cavities 20.

The cavities 20 can have any suitable shape. For instance, the cavities can be square, rectangular, polygonal, irregular, or any other suitable shape. In some embodiments, however, FIG. 1 shows the cavities 20 are substantially square so that a square component (e.g., an active device and/or a passive device) can be placed within each cavity.

The cavities 20 can be formed in the substrate frame 10 in any suitable manner that provides the substrate frame with the described characteristics. Indeed, the array of cavities can be formed through etching, laser cutting, a dicing saw, and/or any other suitable technique.

Figure 2:
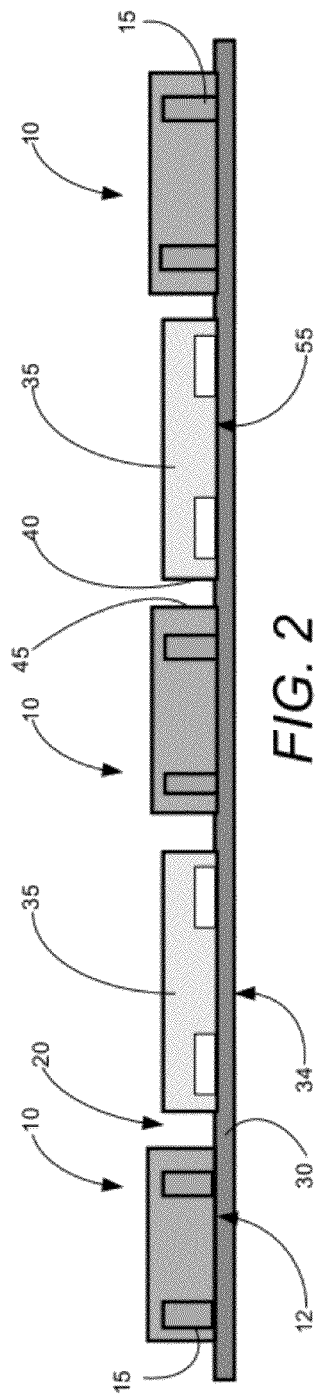
FIG. 2 depicts some embodiments of a portion of a method for making semiconductor packages, wherein the substrate frame is placed on a carrier and an active device is placed on the carrier, within each of the cavities of the substrate frame.

In some embodiments, the substrate frame 10 further comprises one or more vias that are disposed adjacent to one or more perimeters of one or more of the cavities 20, as shown in FIG. 2. Although each via can comprise any suitable conductive material (such as gold, silver, platinum, nickel, Al, solder, etc.), in some embodiments, the vias 15 comprise copper or a copper alloy. The vias 15 in the substrate frame of FIG. 1 are disposed on the underside of the substrate frame 10 and do not penetrate the substrate frame's top or first surface 12. Accordingly, while the vias 15 are not visible in FIG. 1, FIG. 2 shows the vias may extend only partially through substrate frame 10.

FIG. 2 shows that, in some embodiments, the substrate frame 10 is placed on a carrier 30. While this carrier 30 can comprise any suitable carrier, such as a plate-like carrier, a polyimide film, and/or a foil-resin adhesive substrate, FIG. 2 shows some configurations in which the carrier 30 comprises a film carrier 34.

FIG. 2 further shows that one or more active devices 35 (such as one or more IC dice) can be placed on the carrier 30 within one or more of the cavities 20 so that one or more of the active devices' perimeters 40 are disposed adjacent to a perimeter 45 of the cavity 20 of the substrate frame 10. The active devices an substrate frame can be placed on the carrier 30 in any suitable orientation. FIG. 2 shows some orientations in which a first side 12 of the substrate frame 10 and a first side 55 of the active devices 35 can be placed face down on the carrier 30.

FIG. 3 shows that, in some embodiments, the method continues as the substrate frame 10 and active devices 35 are attached to each other to form an embedded die substrate 60. The substrate frame and active devices can be attached to each other in any suitable manner that allows them to form the embedded die substrate 60. FIG. 3 shows some configurations in which one or more perimeters 40 of the active devices 35 are attached to a perimeter 45 of a cavity 20 in the substrate frame 10 through the use of an epoxy 63. The epoxy can comprise any suitable epoxy that can be placed in any suitable manner. In some embodiments, the epoxy comprises a non-conductive epoxy (such as an encapsulation material, a polymer resin, and/or an epoxy with a fine filler) that is placed through a conventional screen printing technique.

As shown in FIG. 3, the vias 15 may not (at least initially) extend completely from the substrate frame's first side 12 to the substrate frame's second side 65. FIG. 4 shows some embodiments in which the method continues by removing material from the second side 65 of the substrate frame 10 so that the vias 15 become through-vias 70 that extend completely from the first side 12 to the second, opposite side 65 of the substrate frame 10. The material can be removed from the second side of the substrate frame in any suitable manner that allows the vias to become through vias. In some embodiments, the material can be removed from the second side of the substrate frame through chemical etching, plasma etching, polishing, and/or grinding.

In some embodiments, FIG. 5 shows that the method can continue when the carrier 30 is peeled off or otherwise removed from the embedded die substrate 60. In some configurations, the embedded die substrate can then be flipped.

After the first side 55 of the active device 35 is exposed, FIG. 6 shows that electrical routing 75 can be applied to electrically connect the active device with one or more adjacent through vias 70. This routing can comprise any suitable type of routing, including metallization comprising a pure sample or alloy of copper, gold, silver, TiNiAgAu, TiNiAgSn, Al, nickel, and/or another electrically-conductive metallic material. Additionally, the routing can be added to the embedded die substrate 60 in any suitable manner, including through the use of electroless plating, deposition, and/or printing.

FIGS. 7A and 7B show some embodiments in which the method continues as one or more passive components (e.g., inductors, resistors, capacitors, etc.) are stacked on and/or electrically attached to the first side 55 of the active devices 35. FIG. 7A shows some embodiments in which a single passive component 80 (e.g., a passive inductor) can be stacked on the first side 55 of the active device 35 and/or the first side 12 of the substrate frame 10. FIG. 7B shows some embodiments in which multiple passive components are stacked on the first side 55 of the active device 35 and/or the first side 12 of the substrate frame 10. In particular, FIG. 7B shows some embodiments in which the passive components comprise an inductor 82, an input capacitor 84, and an output capacitor 86 that are stacked on and/or electrically connected to the first side 55 of the active device 35 and/or the first side 12 of the substrate frame 10 (e.g., with the through via 70).

The passive components (e.g., 80-86) can be physically and/or electrically connected to the active device 35 and/or substrate frame 10 in any suitable manner (e.g., via a conductive adhesive, solder, a re-distribution layer (RDL), a thermally compressed method, etc.). In some embodiments, the passive components are connected to the embedded die substrate 60 through the use of a conductive adhesive. Some examples of suitable conductive adhesives can include lead/tin solder paste, lead-free solder, and silver filled epoxy.

The passive components (e.g., components 80-86) can be connected to each other and/or covered in any suitable manner. FIG. 7A shows that the passive components 80 (e.g., passive inductors) can be attached to each other and/or to the substrate frame 10 through a second epoxy 90 (e.g., a screen-printed, non-conductive epoxy). FIG. 7B shows that one or more of the passive components (e.g., inductor 82, input capacitor 84, and output capacitor 86) and/or metal connect areas 95 can be attached to each other and/or the substrate frame 10 through the use of a conductive adhesive, soldering, or thermally compressive method. Additionally, FIG. 7B shows that one or more components can be encapsulated by a second epoxy or an epoxy molding compound 90. Some non-limiting examples of suitable molding compounds may include thermoset resins—such as silicones, phenolics, and epoxies—and thermoplastics. Moreover, the molding compound can be formed around portions of the desired components as known in the art, including by injection of molding material, transfer molding, and/or other appropriate methods.

FIGS. 8A and 8B shows that the method can continue as bumps 100 (e.g., solder bumps, balls, studs, or combinations thereof) are added to one or more of the through-vias 70. FIGS. 8A and 8B show some embodiments in which the bumps can be added to the second side 65 of the substrate frame 10. While the bumps can comprise any known solder material or other suitable conductive bonding material, in some embodiments, the bumps comprises lead-based bumps, lead-free bumps, copper bumps, electroless NiAu bumps, SnPbAg, PbSn, copper stud bump, Au stud bump, or SnSb bumps.

FIGS. 8A and 8B show that the method can continue as the embedded die substrate 60 (from FIG. 7B) is singulated into individual wafer level embedded packages 105. Although this singulation process can be done in any known manner, in some embodiments, it is accomplished by sawing, punch singulation, or laser cutting. After singulation, the individual packages 105 can be tested and then used in any suitable device, such as a point-of-load buck converter in a portable device.

Figure 9:
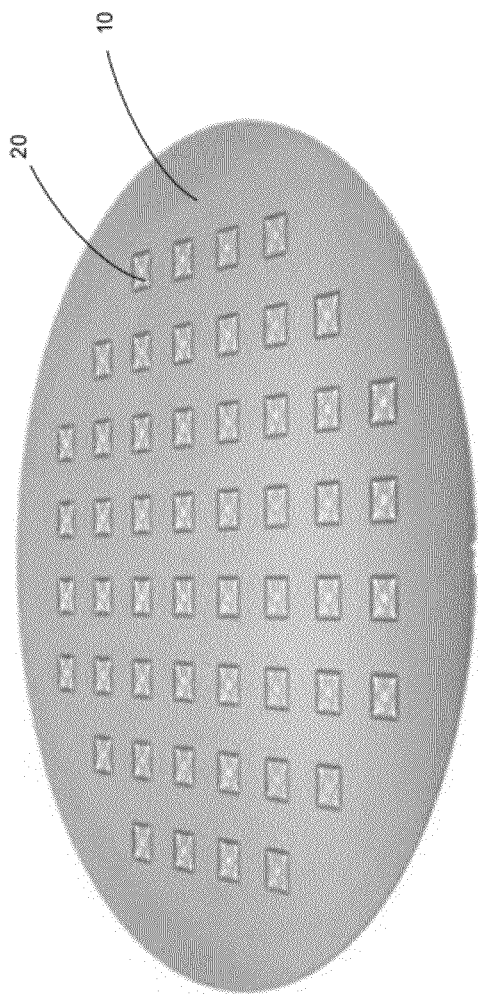
FIG. 9 depicts a perspective view of some embodiments of a wafer-size substrate frame comprising an array of through cavities.
Figure 10:
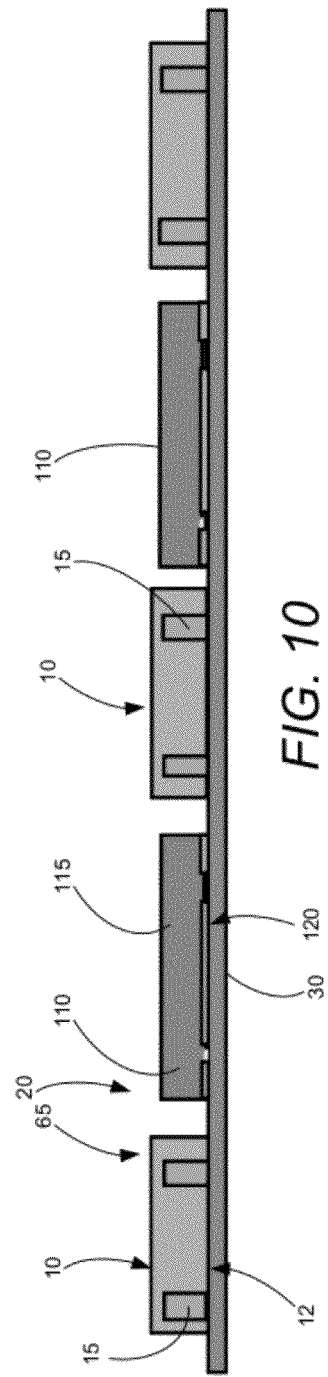
FIG. 10 depicts some embodiments of a portion of a method for making semiconductor packages, wherein the substrate frame is placed on the carrier and a passive device is placed on the carrier within each of the cavities of the substrate frame.
Figure 11:
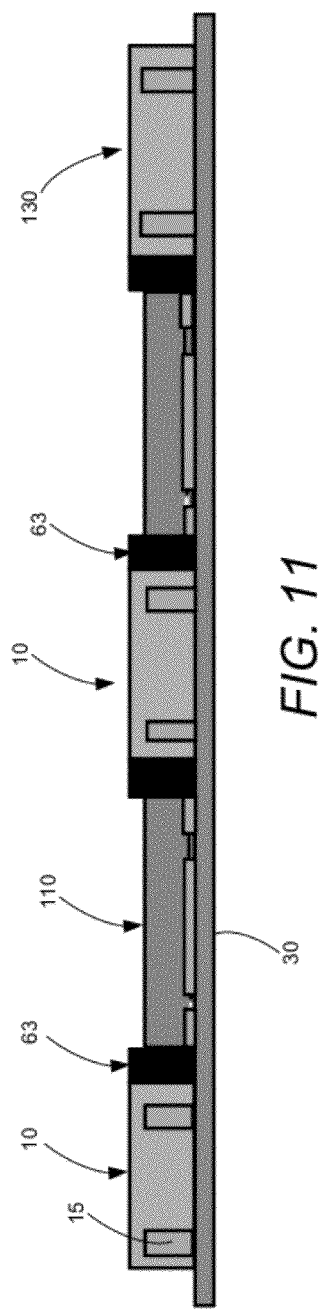
FIG. 11 depicts some embodiments of a portion of a method for making semiconductor packages, wherein each of the passive devices is attached to a perimeter of the a cavity of the substrate frame.
Figure 12:
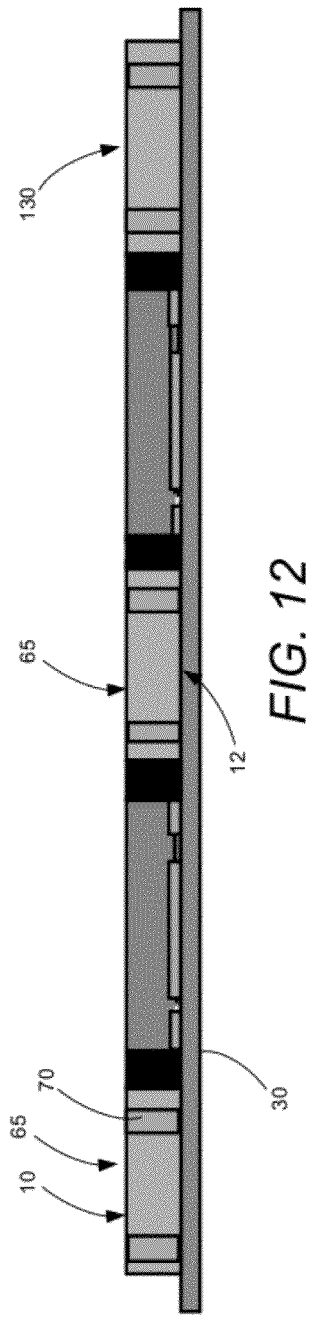
FIG. 12 depicts some embodiments of a portion of a method for making semiconductor packages, wherein some material at a backside of the substrate frame is removed to make through-vias.
Figure 13:
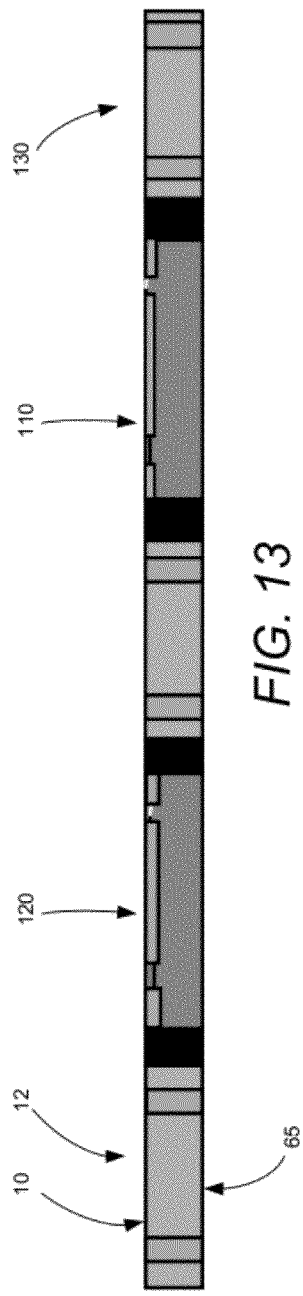
FIG. 13 depicts some embodiments of a portion of a method for making semiconductor packages, wherein the substrate frame and attached passive devices are removed from the carrier and flipped.

In other embodiments, stacked die (or stack die) power SiP semiconductor packages can be made using similar methods, as shown in FIGS. 9 through 16. FIG. 9 shows that these methods can begin by providing a wafer level substrate frame 10 (e.g., a glass, silicon, or epoxy molded compound). FIG. 10 shows that instead of placing an active component 35 within each of the cavities 20 of the substrate frame 10, as discussed above, these methods continue by placing one or more passive devices (e.g., a passive inductor 115, capacitor, resistor, etc.) within each of the cavities 20. FIG. 10 shows that the first surface 12 of the substrate frame 10 and a first surface 120 of the passive devices 110 can be placed face down on the carrier 30.

Similar to the method for producing wafer level embedded packages 105 discussed above, FIGS. 11, 12, 13, and 14 respectively show that the method for forming stack die power SiP packages can include processes for attaching the substrate frame 10 and passive devices 110 to each other (e.g., via an epoxy 63), removing a portion of the second side 65 of the substrate frame 10 (e.g., through grinding), removing the carrier 30 and flipping the embedded die substrate 130, and applying routing 75 (e.g., a routed metallization layer) to the first side 120 of the passive device 110 to electrically connect the passive device with one or more adjacent through vias 70 (e.g., through glass vias).

FIGS. 15A and 15B show that the method can continue as one or more active components 125 are stacked on and electrically connected to (e.g., via soldering, a conductive epoxy, routing 75, a gold-to-gold stud interconnect, etc.) the first surface 120 of the passive component 110. The active component can comprise any active device that is suitable for use with the described stack die power SiP package 135 (shown in FIG. 16). Some examples of suitable active components include one or more IC dice, IC drivers, and/or IC controllers.

As shown in FIGS. 15A and 15B, the method can continue as bumping can be connected to one or more of the through-vias 70. While this bumping can be applied to any suitable location on the on the embedded die substrate 130, FIG. 15A shows some embodiments in which the bumps 100 can be attached to the through vias 70 at the second side 65 of the substrate frame 10. FIG. 15B shows some embodiments in which bumps 100 can be applied at the first side 12 of the substrate frame 10.

FIG. 16 shows that the embedded die substrate 130 can then be singulated. Following singulation, the individual stack die power SiP packages 135 can be tested and then be used in any suitable device, such as a cell phone, portable electronic device, a portable digital assistant, USB, audio device, system power application, low-voltage power application, and/or mobile media player.

In some configurations, the singulated stack die power SiP packages 135 can be stacked or otherwise connected to each other in any known manner. For example, where a first stack die package comprises bumps 100 on its first side 140, a second package can be stacked on the first package and the first package's bumps can be electrically connected to the second package's through vias 70 at a second side 145 of the second package. Similarly, where a first stack die package comprises bumps on its second side 145, the second side 145 of the first package can be stacked on the first side 140 of the second package so that the bumps from the first package electrically connects to the vias of the second package at the first side of the second package.

This application also relates to a semiconductor package comprising: an active device having a first side, a second side, and a perimeter; and a substrate frame having a first side and a second side, wherein the substrate frame comprises a through cavity and an adjacent through via extending between the substrate frame's first side and second side, wherein the perimeter of the active device is attached to a perimeter of the cavity of the substrate frame, and wherein routing disposed across a portion of the first side of the active device and the first side of the substrate frame electrically connects the active device to the through via.

This application relates to a semiconductor package comprising: an passive device having a first side, a second side, and a perimeter; an active component stacked on and electrically connected to the first side of the passive device; and a substrate frame having a first side and a second side, wherein the substrate frame comprises a through cavity with at least one adjacent through via extending between the substrate frame's first side and second side, wherein the perimeter of the passive device is attached to a perimeter of the cavity of the substrate frame, and wherein routing disposed across a portion of the first side of the passive device and the first side of the substrate frame electrically connects the passive device and the active component to the through via.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A method for making a semiconductor package, comprising:
   placing a first side of substrate frame on a carrier, the substrate frame comprising a through cavity that extends from the first side to a second side of the substrate frame and a via that is adjacent to the cavity and that is exposed on the first side of the substrate frame;
   placing a first side of a component on the carrier within the cavity of the substrate frame, wherein the component comprises an active device or a passive device;
   attaching a perimeter of the cavity of substrate frame to a perimeter of the component;
   removing material from the second side of the substrate frame so that the via extends from the first side to the second side of the substrate frame;
   removing the substrate frame and the attached component from the carrier; and
   placing routing between the first side of the substrate frame and the first side of the component to electrically connect the component with the via.

2. The method of claim 1, wherein the substrate frame comprises glass, silicon, a pre-molded epoxy molding compound, or a combination thereof.

3. The method of claim 1, wherein the substrate frame comprises glass.

4. The method of claim 1, wherein the component comprises an active device.

5. The method of claim 4, further comprising stacking and electrically attaching a first passive component to a portion of the first side of the active device.

6. The method of claim 4, further comprising stacking and electrically attaching multiple passive components to the first side of the active device.

7. The method of claim 4, further comprising applying a bump to the via at the second side of the substrate frame.

8. The method of claim 4, further comprising applying a solder bump to the via at the first side of the substrate frame.

9. The method of claim 1, wherein the component comprises a passive device.

10. The method of claim 9, wherein the passive device comprises an inductor.

11. The method of claim 9, further comprising stacking and electrically connecting an integrated circuit die to the first side of the passive device.

12. The method of claim 9, further comprising applying a bump to the via at the second side of the substrate frame.

13. A method for forming a wafer level embedded package, comprising:
   placing a first side of substrate frame on a carrier, wherein the substrate frame comprises a through cavity that extends from the first side to a second side of the substrate frame and a via that is adjacent to the cavity and that is exposed on the first side of the substrate frame;
   placing a first side of an active device on the carrier within the cavity of the substrate frame;
   attaching a perimeter of the cavity of the substrate frame to a perimeter of the active device;
   removing material from the second side of the substrate frame so that the via extends from the first side to the second side of the substrate frame;
   removing the substrate frame and the attached active device from the carrier;
   placing routing between the first side of the substrate frame and the first side of the active device to electrically connect the active device with the via; and
   stacking and electrically attaching a first passive component to the first side of the active device.

14. The method of claim 13, further comprising stacking and electrically attaching an additional passive component to the first side of the active device.

15. The method of claim 13, wherein the substrate frame comprises glass, silicon, an epoxy molding compound, or a combination thereof.

16. The method of claim 13, wherein the substrate frame comprises glass.

17. The method of claim 13, further comprising applying a bump to the via at the second side of the substrate frame.

18. A method for forming a stacked die system-in-package semiconductor device, the method comprising:
- placing a first side of substrate frame on a carrier, wherein the substrate frame comprises a through cavity that extends from the first side to the second side of the substrate frame and a via that is adjacent to the cavity and that is exposed on the first side of the substrate frame;
- placing a first side of passive device on the carrier within the cavity of the substrate frame;
- attaching a perimeter of the cavity of the substrate frame to a perimeter of the passive device;
- removing material from the second side of the substrate frame so that the via extends from the first side to the second side of the substrate frame;
- removing the substrate frame and the attached passive device from the carrier;
- placing routing between the first side of the substrate frame and the first side of the passive device to electrically connect the passive device with the via; and
- stacking and electrically connecting an integrated circuit die to the first side of the passive device.

19. The method of claim 18, wherein the passive device comprises an inductor.

20. The method of claim 18, further comprising applying a bump to the via at the first side of the substrate frame.

* * * * *